United States Patent [19]
Kito et al.

[11] Patent Number: 6,110,279
[45] Date of Patent: Aug. 29, 2000

[54] METHOD OF PRODUCING SINGLE-CRYSTAL SILICON CARBIDE

[75] Inventors: Yasuo Kito; Youichi Kotanshi, both of Okazaki; Shoichi Onda, Toyokawa; Tatuyuki Hanazawa, Okazaki; Eiji Kitaoka, Anjo, all of Japan

[73] Assignee: Denso Corporation, Kariya, Japan

[21] Appl. No.: 09/049,979

[22] Filed: Mar. 30, 1998

Related U.S. Application Data

[63] Continuation-in-part of application No. 08/826,147, Mar. 27, 1997, abandoned.

[30] Foreign Application Priority Data

| Mar. 29, 1996 | [JP] | Japan | 8-75775 |
| May 20, 1997 | [JP] | Japan | 9-129875 |
| Jun. 19, 1997 | [JP] | Japan | 9-163087 |

[51] Int. Cl.⁷ .................................................. C30B 17/00
[52] U.S. Cl. ..................... 117/105; 117/109; 117/915
[58] Field of Search .......................... 117/951, 105, 117/109, 915

[56] References Cited

U.S. PATENT DOCUMENTS

| 4,147,572 | 4/1979 | Vodakov et al. |
| 4,556,436 | 12/1985 | Addamiano |
| 4,866,005 | 9/1989 | Davis et al. |
| 5,037,502 | 8/1991 | Suzuki et al. |
| 5,441,011 | 8/1995 | Takahaski et al. |
| 5,471,946 | 12/1995 | Scholz et al. |
| 5,501,173 | 3/1996 | Burk, Jr. et al. |

FOREIGN PATENT DOCUMENTS

| 61-243000 | 10/1966 | Japan |
| 53-147700 | 12/1978 | Japan |
| 55-144499 | 11/1980 | Japan |
| 60-14000 | 4/1985 | Japan |
| 61-222992 | 10/1986 | Japan |
| 63-57400 | 11/1988 | Japan |
| 1-38080 | 8/1989 | Japan |
| 5-208897 | 8/1993 | Japan |
| 6-24900 | 2/1994 | Japan |
| 6-48898 | 2/1994 | Japan |

OTHER PUBLICATIONS

Single Crystal Growth of Hexagonal Sic on Cubic Sic by Intentional Polytype Control, Woo Sik Yoo et al (Also see Appln. p. 5), pp. 278–283.

*Primary Examiner*—Felisa Hiteshew
*Attorney, Agent, or Firm*—Pillsbury, Madison & Sutro, LLP

[57] ABSTRACT

A (111) cubic silicon carbide single-crystal layer is formed on a (111) silicon wafer, and then the silicon wafer is removed. Thus prepared (111) cubic silicon carbide single-crystal layer is disposed in a graphite crucible to function as a seed crystal. Silicon carbide source material powder is also held in the graphite crucible and sublimated in an atmosphere including inert gas, while controlling a temperature of the (111) cubic silicon carbide single-crystal layer to be lower than a temperature of the silicon carbide source material powder. As a result, a (0001) α-type silicon carbide single-crystal layer can be formed on the (111) cubic silicon carbide single-crystal layer with a large diameter and high quality at low cost.

48 Claims, 11 Drawing Sheets

(111)

(0001)

METHOD OF PRODUCING SINGLE-CRYSTAL SILICON CARBIDE

CROSS REFERENCE TO RELATED APPLICATIONS

This application is a continuation-in-part of U.S. patent application Ser. No. 08/826,147, filed Mar. 27, 1997, abandoned, and is based upon and claims the benefit of priority of the prior Japanese Patent Applications No. 8-75775 filed on Mar. 29, 1996, No. 9-129875 filed on May 20, 1997, and No. 9-163087 filed on Jun. 19, 1997, the contents of which are incorporated herein by reference.

BACKGROUND OF THE INVENTION

1. Field of the Invention

The present invention relates to a method of producing single-crystal silicon carbide.

2. Related Arts

In recent years, a single-crystal substrate of silicon carbide has been developed as a semiconductor substrate for a semiconductor device such as a transistor, a diode or the like, which can withstand to high voltage and is operable with large electric power. Methods known in the art for producing the single-crystal substrate of silicon carbide are the Acheson method, the Lely method, the sublimation-recrystallization method (i.e., the modified Lely method) and the like. Among these methods, the sublimation-recrystallization method is conventionally adopted because it is advantageous to the growth of silicon carbide single-crystal substrate having a large area and high quality.

As disclosed in JP-B2-63-57400, in the sublimation-recrystallization method, silicon carbide source material held in a graphite crucible is heated for sublimation, whereby single-crystal silicon carbide is grown on a silicon carbide seed substrate made of single-crystal silicon carbide. The silicon carbide seed substrate is disposed opposite to the silicon carbide source material in the same graphite crucible. Thus obtained single-crystal silicon carbide has a large area and the polytype thereof is controlled. Therefore, it is suitable for the semiconductor substrate. Further, on the single-crystal substrate of silicon-carbide, a silicon carbide single-crystal layer having the different conductivity type or the different carrier concentration from the single-crystal substrate can be epitaxially grown by a liquid phase epitaxial (LPE) method or chemical vapor deposition (CVD) method.

However, the diameter of the silicon carbide single-crystal substrate obtained by the above-mentioned method is only approximately 1 inch. Therefore, it is needed to make the diameter of the-single-crystal silicon carbide substrate larger in order to mass-producing the semiconductor device such as the transistor or the like using the substrate.

Silicon carbide has many polytype structures each of which has a different crystal structure. These polytype structures are classified into an α-type and β-type. Polytype structures of the α-type have crystal structures belonging to a hexagonal system and rhombohedral system. The hexagonal system is further classified into a 6H-type, 4H-type and the like on the basis of the number of laminated lattice planes within one cycle in the crystal structure. The rhombohedral system is further classified into a 15R-type, 21R-type and the like in the same way. A polytype structure of β-type has a crystal structure belonging to a cubic system having only a 3C-type.

The electrical properties of the silicon carbide single-crystal substrate differ depending on the polytype structure. Therefore, when a specified semiconductor device utilizing a silicon carbide single-crystal substrate is produced, the polytype structure of silicon carbide is chosen on the basis of the required electrical properties of the semiconductor device. Further, the electrical properties of the silicon carbide single-crystal substrate differ depending on the crystal plane of the surface of the substrate. In a case that a semiconductor element having a geometrical shape such as a transistor or the like is formed on the silicon carbide single-crystal substrate, symmetry property of the silicon carbide crystal structure is also important. Concerning the α-type silicon carbide single-crystal substrate, when the surface of the substrate has a (0001) plane, the symmetry property is maximum. Accordingly, it is suitable as a substrate for the semiconductor device. The α-type silicon carbide single-crystal substrate is especially effective to improve the characteristics of the semiconductor device which can withstand to high voltage and to which large electric power is applied. Therefore, it is desirable that the α-type silicon carbide single-crystal substrates having a large diameter and high quality are produced in large quantities at low cost.

As a conventional technique to increase the diameter of the silicon carbide substrate, it is known that the Acheson crystal shaped and ground in advance can be used as a seed crystal to produce the silicon carbide single-crystal substrate thereon in the sublimation-recrystallization method. The Acheson crystal is single-crystal silicon carbide incidentally obtained in a process for producing silicon carbide abrasives in the Acheson furnace.

It is, however, difficult to produce the Acheson crystal having a large size. Therefore, JP-A-6-48898 proposes a method, in which silicon carbide is grown on the seed crystal having a small size in the beginning and is repeatedly grown so that the size of the single-crystal silicon carbide gradually becomes large.

JP-B2-1-38080 proposes another method. In the method, a β-type silicon carbide single-crystal layer is epitaxially grown on a silicon substrate, and then the silicon substrate is removed. Thereafter, an α-type silicon carbide single-crystal layer is grown on the β-type silicon carbide single-crystal layer by a CVD method. The method proposed in JP-B2-1-38080 has a possibility capable of producing the α-type silicon carbide single-crystal substrate having a large diameter.

Further, "Journal of Crystal Growth 99", 1990, PP. 278–283 reports another method in which a hexagonal single-crystal silicon carbide is grown on a (100) cubic silicon carbide layer by the sublimation-recrystallization method. The (100) cubic silicon carbide layer functions as a seed crystal. This method also has a possibility capable of producing the α-type silicon carbide single-crystal substrate having a large diameter.

However, the method proposed in JP-A-6-48898 involves a complicated process for growing silicon carbide repeatedly, thereby resulting in the rise in cost. Further, the diameter of the silicon carbide substrate is limited to only 2 to 3 inches at most in the present laboratory level.

In the method proposed in JP-B2-1-38080, the α-type silicon carbide single-crystal layer can be grown so as to have a required diameter. However, the α-type silicon carbide single-crystal layer is an epitaxial layer formed by the CVD method. Because of this, the thickness of the α-type silicon carbide single-crystal layer obtained in this method is 2 μm at most, and it is difficult to produce bulk single-crystal silicon carbide having a thickness of more than 300 μm required as a substrat. Further, in the method proposed in "Journal of Crystal Growth 99",1990, PP. 278–283, although it has a possibility to produce bulk single-crystal silicon carbide, it is difficult to produce single-crystal silicon carbide having a (0001) plane. The surface of the single-crystal silicon carbide has a (01$\bar{1}$4) plane.

SUMMARY OF THE INVENTION

The present invention has been made in view of the above-mentioned problems. A first object of the present invention is to provide a method for producing a (0001) α-type silicon carbide single-crystal substrate having a large diameter and high quality. Further, a second object of the present invention is to provide a method for producing a (0001) α-type silicon carbide single-crystal substrate at low cost.

In a method according to the present invention, a (111) cubic silicon carbide single-crystal layer is used as a seed crystal. On the (111) cubic silicon carbide single-crystal layer, an α-type single-crystal silicon carbide is grown by sublimating a silicon carbide source material in an atmosphere including inert gas. In this case, a temperature of the (111) cubic silicon carbide single-crystal layer is controlled to be lower than a temperature of the silicon carbide source material. The α-type single-crystal silicon carbide formed in this way can have a sufficient thickness as a substrate.

Further, because the (111) cubic silicon carbide single-crystal layer is prepared by growing on a (111) silicon single-crystal substrate, the (111) cubic silicon carbide single-crystal layer have the same diameter as that of the (111) silicon single-crystal substrate. In the present level of the art, it is easy to get the silicon single-crystal substrate having a diameter of 8 to 10 inches. It means that the α-type single-crystal silicon carbide having a diameter of 8 to 10 inches can be produced.

Further, the α-type single-crystal silicon carbide can be grown in a single crystal growth process, thereby resulting in mass production and low cost.

The atomic arrangement on the (111) plane of the cubic silicon carbide single-crystal layer is the same as that on the (0001) plane of the α-type single-crystal silicon carbide. Therefore, the (0001) α-type single-crystal silicon carbide can be formed on the (111) cubic silicon carbide single-crystal layer without having any defects.

To further improve crystallinity of the α-type single-crystal silicon carbide, an α-type silicon carbide single-crystal layer can be formed on the (111) cubic silicon carbide single-crystal layer before forming the α-type single-crystal silicon carbide. In this case, the α-type silicon carbide single-crystal layer serves as a seed crystal for the α-type single-crystal silicon carbide.

The (111) silicon carbide single-crystal layer may be disposed in a growth apparatus together with the (111) silicon single-crystal substrate before forming the α-type single-crystal silicon carbide. In such a case, the (111) silicon single-crystal substrate can be removed from the (111) silicon carbide single-crystal layer to expose the (111) cubic silicon carbide single-crystal layer at a temperature higher than a melting point of silicon. Then, the α-type single-crystal silicon carbide is formed on the exposed (111) cubic silicon carbide single-crystal layer. Otherwise, the (111) silicon single-crystal substrate may be removed from the (111) cubic silicon carbide single-crystal layer before the (111) cubic silicon carbide single-crystal layer is disposed in a growth apparatus.

Preferably, after the (111) cubic silicon carbide single-crystal layer is formed on the (111) silicon single-crystal substrate, a reinforcement layer is formed on the (111) cubic silicon carbide single-crystal layer. Thereafter, the (111) silicon single-crystal substrate is removed from the (111) cubic silicon carbide layer and the reinforcement layer. The (111) cubic silicon carbide single-crystal layer is fixed to a vessel through the reinforcement layer in the growth apparatus. In this case, the reinforcement layer can prevent damage to the (111) cubic silicon carbide single-crystal layer under its handling.

Concerning growth conditions, it is desirable that a growth rate of the α-type single-crystal silicon carbide is equal to or lower than 0.2 mm/hr in an initial growth thereof. As a result, the α-type single-crystal silicon carbide having a crystal structure different from that of the seed crystal can grow on the (111) cubic silicon carbide single-crystal layer without being polycrystallized.

The growth rate may be approximately in a range of 0.2 to 2 mm/hr after the initial growth. As a result, the growth rate is accelerated and good productivity can be obtained. In this case, the crystal growth of the α-type single-crystal silicon carbide can be successively performed.

When the temperature of the silicon carbide source material is approximately in a range of 2300° C. to 2350° C. and the temperature of the (111) cubic silicon carbide single-crystal layer is lower by 50° C. to 120° C. than that of the silicon carbide source material, the quality of the α-type single-crystal silicon carbide is further improved.

Further, when a pressure of inert gas is approximately in a range of 0.1 Torr to 100 Torr, the growth conditions become more suitable for the α-type single-crystal silicon carbide.

In a case that a silicon member is disposed between the (111) cubic silicon carbide single-crystal layer and the silicon carbide source material in the growth apparatus, a partial pressure of silicon in the growth apparatus becomes large. As a result, it is prevented that silicon element escapes from the surface of the (111) cubic silicon carbide single-crystal layer in the initial growth. That is, the surface of the (111) cubic silicon carbide single-crystal layer is prevented from being carbonized, resulting in high quality of the α-type single-crystal silicon carbide.

BRIEF DESCRIPTION OF THE DRAWINGS

These and other objects and features of the present invention will become more readily apparent from a better understanding of preferred embodiments described below with reference to the following drawings.

DETAILED DESCRIPTION OF THE PREFERRED EMBODIMENTS

Embodiments according to the present invention will be described hereinunder with reference to the drawings.

First Embodiment

Figure 1:
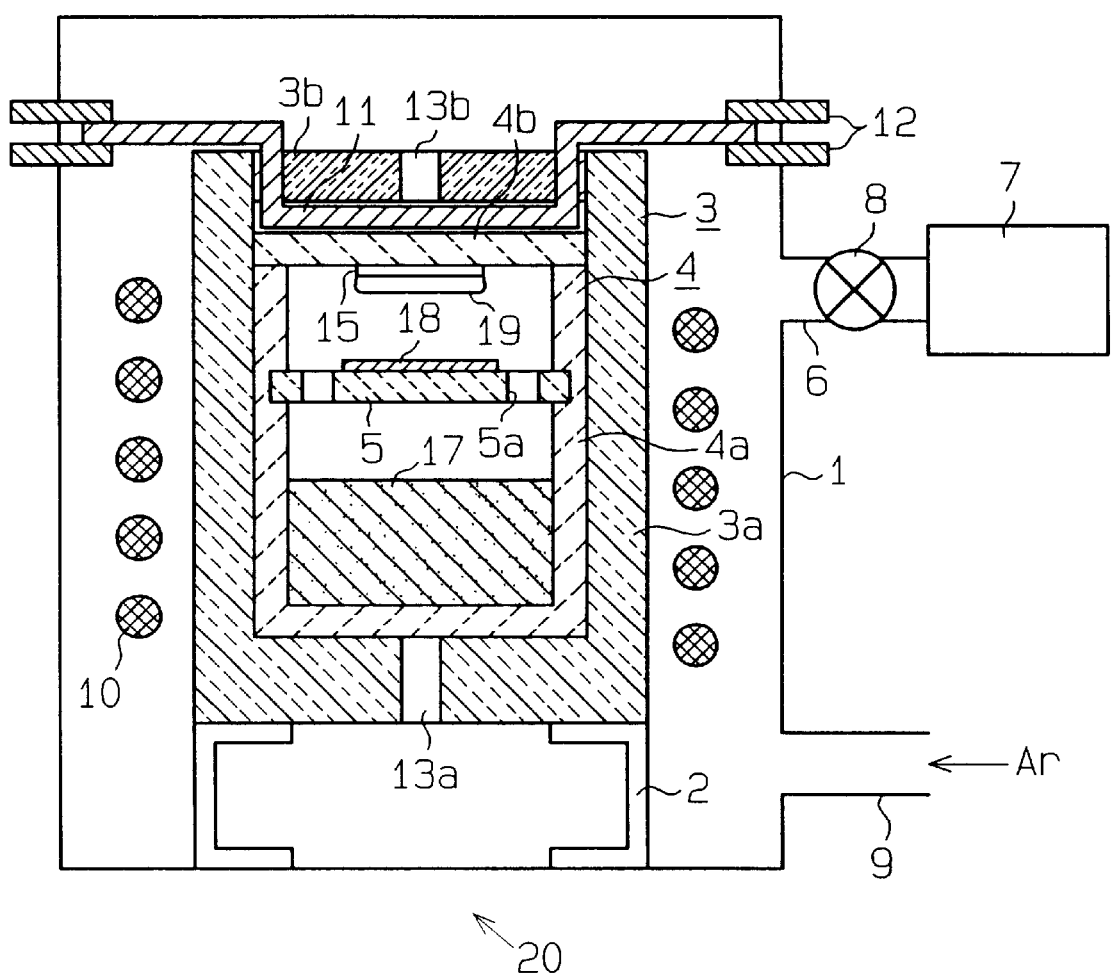
FIG. 1 is a cross-sectional view showing a crystal growth apparatus for forming a (0001) α-type silicon carbide single-crystal layer according to a first embodiment of the present invention.

FIG. 1 shows a crystal growth apparatus 20 employed in a first embodiment to form bulk single-crystal silicon carbide by a sublimation-recrystallization method. As shown in FIG. 1, a base 2 is provided in a vacuum chamber 1, and a graphite crucible 4 covered by a heat insulating material 3 is disposed on the base 2. The graphite crucible 4 is composed of a crucible body 4a having an opening at the upper face thereof and a crucible lid 4b for closing the opening of the crucible body 4a. The crucible lid 4b functions as a base for supporting a (111) cubic silicon carbide single-crystal layer 15 which functions as a seed crystal. Further, in the graphite crucible 4, a supporting plate 5 made of graphite is fixed to the graphite crucible 4 to be on an upper side of silicon carbide source material powder 17 when the silicon carbide source material powder 17 is put at the bottom of the crucible body 4a. A mass of silicon 18 is disposed at the center of the supporting plate 5, while through holes 5a are formed at the periphery of the supporting plate 5.

The heat insulating material 3 has a main portion 3a for covering the bottom face and the side face of the graphite crucible 4, and a lid portion 3b for covering the upper portion of the graphite crucible 4.

The vacuum chamber 1 communicates with a vacuum pump 7 through an exhaust pipe 6 so that the inside of the vacuum chamber 1 is evacuated by the vacuum pump 7. An exhaust valve 8 is provided in the exhaust pipe 6. The vacuum chamber 1 further communicates with an inert gas introducing pipe 9 so that argon gas as the inert gas is introduced into the vacuum chamber 1 through the inert gas introducing pipe 9.

An induction coil 10 is provided on the outer circumferential side of the heat insulating material 3 in the vacuum chamber 1. Electrical power is supplied to the induction coil 10 from a high frequency power supply (not shown) so that the graphite crucible 4 is heated by induction heating.

Disposed between the crucible lid 4b and the lid portion 3b of the heat insulating material 3 is a resistant heating heater 11 connected to the power supply (not shown) through electrodes 12 and electrical power cables (not shown). Electrical power is supplied to the resistant heating heater 11 from the power supply to control the temperature of the (111) cubic silicon carbide single-crystal layer 15 fixed on the crucible lid 4b.

The heat insulating material 3 has a temperature measurement hole 13a at the bottom face thereof so that the temperature of the crucible body 4a can be measured. That is, light is taken out from the bottom face of the crucible body 4a through the temperature measurement hole 13a to enter a radiation pyrometer, so that the temperature of the crucible body 4a is measured by the radiation pyrometer. Further, the lid portion 3b of the heat insulating material 3 has a temperature measurement hole 13b so that the temperature of the resistant heating heater 11 can be measured in the same way as mentioned above.

Next, a method of manufacturing bulk single-crystal silicon carbide will be described.

Figure 2:
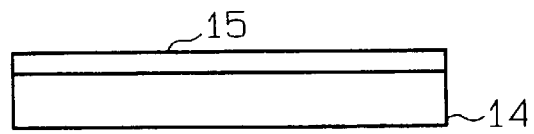
FIG. 2 is a cross-sectional view for explaining a process for forming the (0001) α-type silicon carbide single-crystal layer in the first embodiment.
Figure 7:
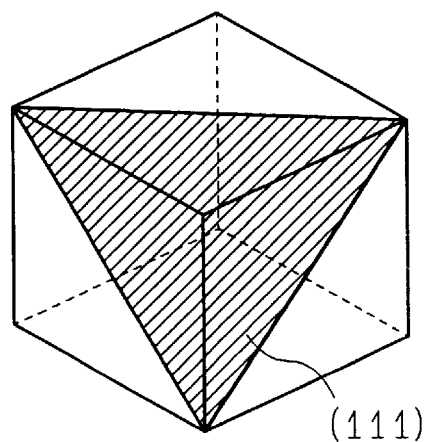
FIG. 7 is an illustration showing a (111) plane of a cubic-type crystal.

Firstly, as shown in FIG. 2, a silicon wafer 14 having a diameter of approximately 4 inches is prepared. The silicon wafer 14 is a silicon single-crystal substrate which has a cubic crystal structure and of which the surface has a (111) plane. The (111) cubic silicon carbide single-crystal layer 15 is epitaxially grown on the silicon wafer 14 by a CVD method. In more detail, a chemical reaction occurs between gas supplying a carbon element such as methane gas and gas supplying a silicon element such as silane gas, thereby forming the silicon carbide layer 15 in the CVD process. FIG. 7 shows a (111) plane in a cubic crystal structure.

Figure 3:
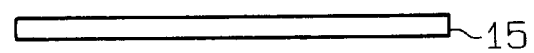
FIG. 3 is a cross-sectional view for explaining a process for forming the (0001) α-type silicon carbide single-crystal layer in the first embodiment.

Thereafter, as shown in FIG. 3, the silicon wafer 14 having the silicon carbide single-crystal layer 15 is immersed in a solution including hydrofluoric acid and nitric acid. As a result, the silicon wafer 14 is resolved, whereby only the silicon carbide single-crystal layer 15 remains. Thus, the silicon wafer 14 is removed by a chemical technique using the solution capable of resolving silicon. In the first embodiment, although the chemical technique using the solution of hydrofluoric acid and nitric acid is employed, a mechanical polishing technique may be employed instead of the chemical technique.

Figure 4:
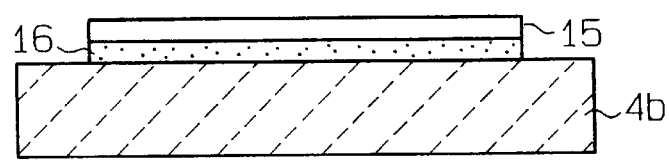
FIG. 4 is a cross-sectional view for explaining a process for forming the (0001) α-type silicon carbide single-crystal layer in the first embodiment.

Next, the crucible lid 4b is detached from the crystal growth apparatus 20 shown in FIG. 1. As shown in FIG. 4, the cubic silicon carbide single-crystal layer 15 having the (111) plane exposed by removing the silicon wafer 14 is bonded to the crucible lid 4b through adhesives 16.

The (111) cubic silicon carbide single-crystal layer 15 may be directly joined to the crucible lid 4b with a direct junction without using the adhesives 16.

The crucible lid 4b is mounted in the crystal growth apparatus 20 again, whereby the (111) cubic silicon carbide single-crystal layer 15 is disposed at the lower face of the crucible lid 4b in the crystal growth apparatus 20 as shown in FIG. 1.

The graphite crucible 4 is filled with silicon carbide source material powder 17 of 100 g. To obtain the silicon carbide source material powder 17, silicon carbide powder put on the market as abrasives, the average particle size of which is approximately 500 $\mu$m, is heated at 1800° C.–2000° C. under vacuum in advance. Further, the mass of silicon 18 is put on the supporting plate 5. Although the mass of silicon 18 is a plate obtained from a silicon wafer, it may be silicon powder.

In this state, the vacuum chamber 1 is evacuated to a vacuum level of $10^{-3}$ to $10^{-4}$ Torr through the exhaust pipe 6 and the exhaust valve 8.

Next, the electrical power is supplied to the induction coil 10 from the high frequency power supply, thereby heating the graphite crucible 4 by induction heating. The temperature of the graphite crucible 4 is measured by the radiation pyrometer through the temperature measurement hole 13a. After the temperature is raised to 1200° C., argon gas is introduced into the vacuum chamber 1 through the inert gas introducing pipe 9 until the pressure in the vacuum chamber 1 becomes 500 Torr.

Thereafter, the electrical power is supplied to the induction coil 10 again to raise the temperature of the graphite crucible 4 to 2330° C. so that the temperature of the silicon carbide source material powder 17 reaches its sublimation temperature. The temperature of the (111) cubic silicon carbide single-crystal layer 15 is controlled by the electrical power supplied to the resistant heating heater 11 so as to be 2210° C., while measured by the radiation pyrometer through the temperature measurement hole 13b. The temperature of the (111) cubic silicon carbide single-crystal layer 15 is lower by 120° C. than the temperature of the crucible body 4a and the silicon carbide powder 17. In a state that the temperatures of the silicon carbide source material powder 17 and the (111) cubic silicon carbide single-crystal layer 15 are stable, the pressure in the vacuum chamber 1 is reduced by the vacuum pump 7. At the same time, the sublimation of the silicon carbide powder 17 starts, whereby crystal growth of silicon carbide starts. While the crystal growth continues, argon gas is introduced into the vacuum chamber 1 at 10 l/min and the pressure in the vacuum chamber 1 is kept at approximately 1 Torr as a growth pressure by adjusting an opening degree of the exhaust valve 8.

The gas sublimated from the silicon carbide source material powder 17 reaches the surface of the (111) cubic silicon carbide single-crystal layer 15 to progress the crystal growth. In this case, a difference in temperature between the (111) cubic silicon carbide single-crystal layer 15 and the silicon carbide source material powder 17 functions as a driving force for moving the sublimated gas to the surface of the (111) cubic silicon carbide single-crystal layer 15.

Figure 9:
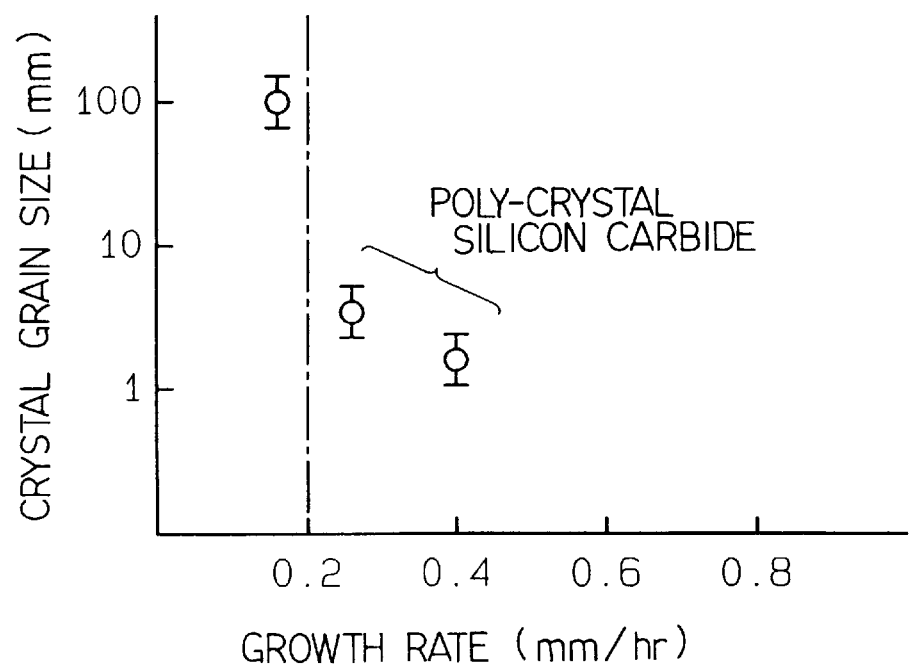
FIG. 9 is a graph showing a relationship between a crystal grain size and a growth rate in the first embodiment.

After keeping the growth pressure for 1 hour, the temperature of the (111) cubic silicon carbide single-crystal layer 15 is raised to 2250° C. by controlling the electrical power supplied to the resistant heating heater 11. The temperature of 2250° C. is kept for 5 hours. A growth rate of single-crystal silicon carbide is changed in response to the temperature of the (111) cubic silicon carbide single-crystal layer 15. In this embodiment, when the temperature is 2210° C., the growth rate is 0.16 mm/hr, and when the temperature is 2250° C., the growth rate is 0.4 mm/hr. For 1 hour from the growth starting time, the growth rate is 0.16 mm/hr, thereby preventing many crystal nuclei from being produced on the surface of the (111) cubic silicon carbide single-crystal layer 15. Therefore, the growth face on the (111) cubic silicon carbide single-crystal layer 15 becomes flat so that single-crystal silicon carbide grows. If the growth rate is more than 0.2 mm/hr, polycrystal silicon carbide grows instead of the single-crystal silicon carbide as shown in FIG. 9.

In the case that the single-crystal silicon carbide grows for 1 hour from the growth starting time with a growth rate equal to or lower than 0.2 mm/hr, even if the growth rate becomes large after that, the single-crystal silicon carbide continuously grows without being polycrystallized. That is, after the initial growth, the temperature of the (111) cubic silicon carbide single-crystal layer 15 is raised to 2250° C. and the growth rate is raised to 0.4 mm/hr, whereby single-crystal silicon carbide can be formed to have a required thickness. After the single-crystal silicon carbide is grown for 5 hours, the supplies of the electric powers to the induction coil 10 and the resistant heating heater 11 are stopped and argon gas is introduced to the vacuum chamber 1. The temperatures of the (111) cubic silicon carbide single-crystal layer 15 and the silicon carbide source material powder 17 are lowered to stop the growth of single-crystal silicon carbide.

Figure 5:
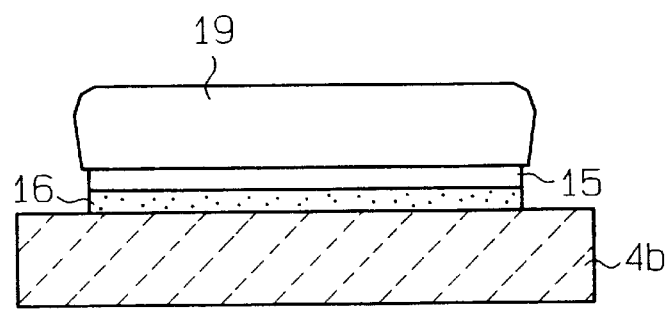
FIG. 5 is a cross-sectional view for explaining a process for forming the (0001) α-type silicon carbide single-crystal layer in the first embodiment.
Figure 8:
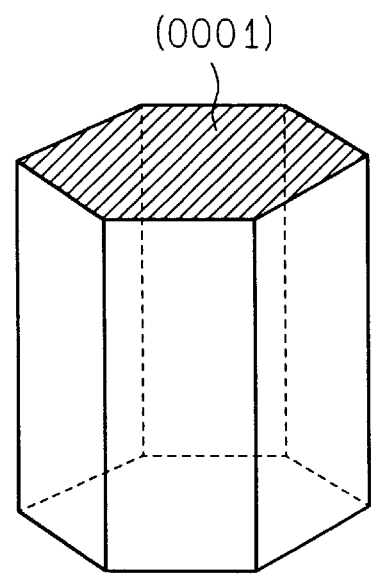
FIG. 8 is an illustration showing a (0001) plane of a hexagonal-type crystal.

Consequently, as shown in FIG. 5, a (0001) $\alpha$-type silicon carbide single-crystal ingot 19 is formed on the (111) cubic silicon carbide single-crystal layer 15. FIG. 8 shows a (0001) plane in an $\alpha$-type crystal structure. The (0001) $\alpha$-type silicon carbide single-crystal ingot 19 has a thickness of approximately 2 mm and a diameter of approximately 4 inches. In this way, silicon carbide single-crystal ingot 19 having a large diameter can be obtained. That is, the silicon carbide source material powder 17 is sublimated in the atmosphere of inert gas in the graphite crucible 4, while the temperature of the (111) cubic silicon carbide single-crystal layer 15 is controlled to be little lower than that of the silicon carbide source material powder 17. As a result, the (0001) $\alpha$-type silicon carbide single-crystal ingot 19 is formed on the (111) cubic silicon carbide single-crystal layer 15.

Further, when silicon carbide is growing, the mass of solid silicon 18 is gasified so that the partial pressure of silicon rises in the vacuum chamber 1. As a result, it is prevented that silicon element escapes from the surface of the (111) cubic silicon carbide single-crystal layer 15 in the beginning of the growth. That is, the surface of the (111) cubic silicon carbide single-crystal layer 15 is prevented from being carbonized.

Figure 6:
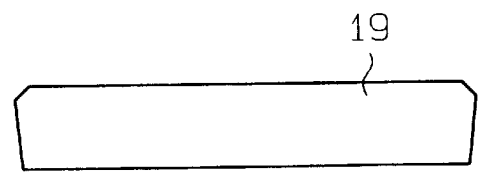
FIG. 6 is a cross-sectional view for explaining a process for forming the (0001) α-type silicon carbide single-crystal layer in the first embodiment.

As shown in FIG. 6, the (0001) $\alpha$-type silicon carbide single-crystal ingot 19 is removed from the crucible lid 4b, and then, it is sliced and polished to form a semiconductor substrate. As a result of studying this substrate by X-ray diffraction analysis and Raman spectroscopy, it is observed that the crystal structure (polytype structure) of the substrate is 6H-type having a (0001) plane.

This substrate can be used for a semiconductor device such as a vertical type MOSFET, a pn diode, a Shottky diode or the like, which is operable with large electric power.

The first embodiment according to the present invention has the following features (A) to (G).

(A) The (0001) $\alpha$-type silicon carbide single-crystal ingot 19 is formed on the seed crystal by the sublimation-recrystallization method. As a result, a substrate which has a enough thickness for using as the semiconductor substrate can be obtained from the (0001) α-type silicon carbide single-crystal ingot 19.

Further, the silicon carbide single-crystal layer 15 formed on the silicon substrate 14 has the same diameter as that of the silicon substrate 14. In the present level of the art, it is easy to get the silicon wafer 14 having a diameter of 8 to 10 inches. It means that the α-type silicon carbide single-crystal ingot 19 having a large diameter of 8 to 10 inches can be produced. Moreover, the silicon carbide single-crystal ingot 19 can be formed in a single growth process, thereby resulting in mass production and low cost.

The atomic arrangement on the surface of the (111) cubic silicon carbide single-crystal layer 15 is the same as that on the surface of the (0001) α-type (6H-type) single-crystal silicon carbide. Therefore, on the (111) cubic silicon carbide single-crystal layer 15, the (0001) α-type silicon carbide single-crystal ingot 19 can be grown without arising any defects.

As a result, the (0001) α-type (6H-type) silicon carbide single-crystal ingot can be produced with a large diameter, the sufficient thickness and high quality. In addition, it can be produced in large quantities at low cost.

(B) By setting the growth rate of the α-type (6H-type) silicon carbide single-crystal ingot 19 at 0.16 mm/hr in the sublimation-recrystallization method, the (0001) α-type (6H-type) silicon carbide single-crystal ingot 19 having the crystal structure different from that of the seed crystal can be formed on the (111) cubic silicon carbide single-crystal layer 15 without being polycrystallized.

(C) After the initial growth wherein the growth rate is 0.16 mm/hr, the growth rate is raised to 0.4 mm/hr. Accordingly, the (0001) α-type (6H-type) silicon carbide single-crystal ingot 19 can be grown to have the sufficient thickness in a short time, while keeping its high quality.

(D) The initial growth and the following growth of the (0001) α-type (6H-type) silicon carbide single-crystal ingot 19 can be successively performed, thereby resulting in good productivity.

(E) In the sublimation-recrystallization method, the temperatures of the silicon carbide source material powder 17 and the (111) cubic silicon carbide single-crystal layer 15 functioning as the seed crystal are controlled to be 2330° C. and in a range of 2210° C. to 2250° C., respectively, whereby the (0001) α-type (6H-type) silicon carbide single-crystal ingot 19 can be grown on the (111) cubic silicon carbide single-crystal layer 15.

(F) In the sublimation-recrystallization method, the pressure of the inert gas is controlled to be 1 Torr, whereby the (0001) α-type (6H-type) silicon carbide single-crystal ingot 19 can be grown.

(G) The mass of silicon 18 is disposed close to the cubic silicon carbide single-crystal layer 15 being the seed crystal between the (111) cubic silicon carbide single-crystal layer 15 and the silicon carbide source material powder 17, whereby the (111) cubic silicon carbide single-crystal layer 15 is prevented from being carbonized in the beginning of the growth. That is, it is prevented that silicon element escapes from the surface of the seed crystal. As a result, the (0001) α-type (6H-type) silicon carbide single-crystal ingot 19 can be formed on the seed crystal with high quality.

Second Embodiment

Next, a second embodiment will be explained. In the first embodiment, the (111) cubic silicon carbide single-crystal layer 15 is directly bonded on the crucible lid 4b after removing the silicon wafer 14. To facilitate the handling of the (111) cubic silicon carbide single-crystal layer 15, however, a reinforcement member may be provide on the (111) cubic silicon carbide single-crystal layer 15. This will be explained in detail.

Figure 10:
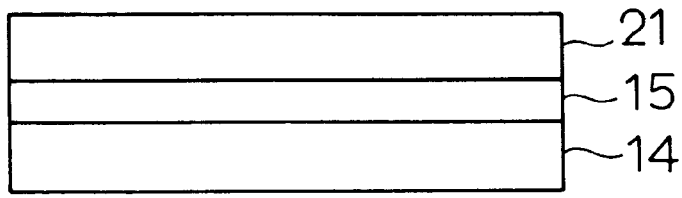
FIG. 10 is a cross-sectional view for explaining a process for forming a (0001) α-type silicon carbide single-crystal layer according to a second preferred embodiment.

As shown in FIG. 2, the (111) cubic silicon carbide single-crystal layer 15 is formed on the silicon wafer 14. Thereafter, as shown in FIG. 10, on the (111) cubic silicon carbide single-crystal layer 15 (on the opposite surface to the silicon wafer 14), a reinforcement layer 21 made of polycrystal silicon carbide is formed by the CVD method. The thickness of the reinforcement layer 21 is approximately 100 μm.

Figure 11:
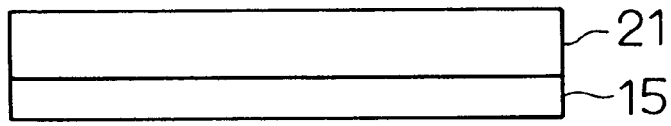
FIG. 11 is a cross-sectional view for explaining a process for forming the (0001) α-type silicon carbide single-crystal layer in the second embodiment.

The silicon wafer 14 is resolved in the solution including hydrofluoric acid and nitric acid and is removed so that only the (111) cubic silicon carbide single-crystal layer 15 and the reinforcement layer 21 remain as shown in FIG. 11. In the process for removing the silicon wafer 14, the reinforcement layer 21 functions as the reinforcement member for preventing the damage to the (111) cubic silicon carbide single-crystal layer 15 under its handling.

Figure 12:
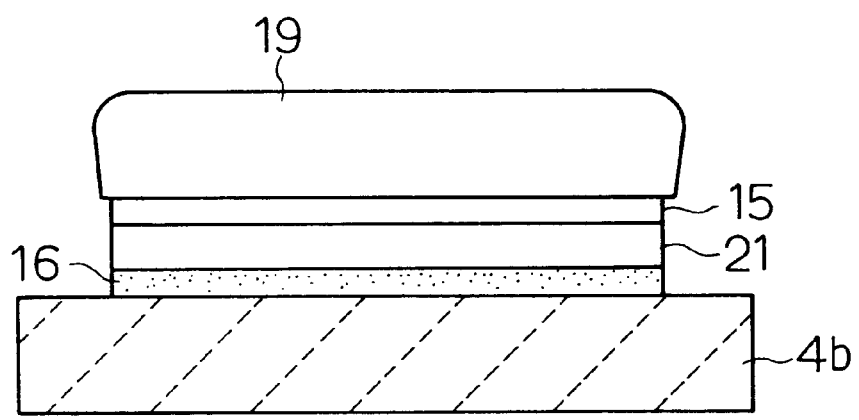
FIG. 12 is a cross-sectional view for explaining a process for forming the (0001) α-type silicon carbide single-crystal layer in the second embodiment.

The (111) cubic silicon carbide single-crystal layer 15 is bonded on the crucible lid 4b through the reinforcement layer 21 and the adhesives 16 as shown in FIG. 12. In this process, the reinforcement layer 21 functions as the reinforcement member for protecting the (111) cubic silicon carbide single-crystal layer 15 as well.

Thereafter, the (0001) α-type silicon carbide single-crystal ingot 19 is formed on the (111) cubic silicon carbide single-crystal layer 15 in the same way as that mentioned in the first embodiment.

In the above-mentioned embodiments, although the temperature of the silicon carbide source material powder 17 is 2330° C., it may be in a range of 2300° C. to 2350° C. When the temperature is lower than 2300° C., an amount of sublimation from the source material becomes small to decrease the growth rate, resulting in low productivity. When the temperature is higher than 2350° C., the amount of sublimation from the source material becomes large to increase the growth rate, giving rise to polycrystallization. That is, the growth conditions suitable for the α-type (6H-type) silicon carbide single-crystal ingot 19 are that the temperature of the silicon carbide source material is in the range of 2300° C. to 2350° C., and the temperature of the seed crystal is lower by 50° C. to 120° C. than that of the silicon carbide source material.

Although the growth rate of the α-type (6H-type) silicon carbide single-crystal ingot 19 is 0.16 mm/hr in the initial growth in the embodiments, it is acceptable that the growth rate is equal to or lower than 0.2 mm/hr. Under this condition, the α-type (6H-type) silicon carbide single-crystal ingot 19 having the crystal structure single-crystal from that of the seed crystal can be grown on the seed crystal without being polycrystallized and with high quality.

Further, although the growth rate after the initial growth is 0.4 mm/hr, it may be in a range of 0.2 mm/hr to 2.0 mm/hr. When the growth rate is lower than 0.2 mm/hr, the productivity is deteriorated, and when the growth rate is more than 2.0 mm/hr, polycrystallization occurs.

Although the growth pressure is 1 Torr in the embodiments, it may be in a range of 0.1 Torr to 100 Torr. When the growth pressure is lower than 0.1 Torr, the amount of sublimation from the source material becomes large to increase the growth rate, thereby giving rise to polycrystallization. When the growth pressure is more than 100 Torr, the amount of sublimation from the source material becomes small to decrease the growth rate, thereby deteriorating the productivity.

The growth rate is controlled by the temperature of the (111) cubic silicon carbide single-crystal layer 15 functioning as the seed crystal. However, the growth rate may be controlled by the temperature of the silicon carbide source material powder 17 or by the growth pressure. Further, the growth rate is changeable by the inside structure of the graphite crucible 4.

In the above-mentioned embodiments, although 6H-type single-crystal silicon carbide is grown, the other α-type single-crystal silicon carbide such as 4H-type can be grown by changing the growth conditions.

Although the (111) cubic silicon carbide single-crystal layer 15 is formed on the silicon wafer 14 by the CVD method, it may be formed by a molecular beam epitaxial method or physical deposition methods represented by a sputtering method. In the molecular beam epitaxial method, solid carbon and solid silicon, or solid silicon carbide are evaporated to form the silicon carbide single-crystal layer. Further, the (111) cubic silicon carbide single-crystal layer 15 may be formed through a solid-phase growth. To put in detail, after carbon ions are implanted into the silicon wafer 14 made of single-crystal silicon, the silicon wafer 14 is heated. As a result, the (111) cubic silicon carbide single-crystal layer 15 can be formed on the surface of the silicon wafer 14 through the solid-phase growth.

A sintered material can be used as the silicon carbide source material instead of the silicon carbide source material powder. A crucible made of metal having a high melting point such as molybdenum, tungsten, tantalum or the like can be adopted instead of the graphite crucible 4.

Although the obtained substrate in the embodiments is composed of bulk single-crystal having a sufficient thickness of more than 300 μm, the present invention can be adopted for a method for producing a single-crystal substrate having a thickness of thinner than 300 μm.

Third Embodiment

In the first embodiment, the (0001) α-type silicon carbide single-crystal ingot 19 is formed on the (111) cubic silicon carbide single-crystal layer 15, which serves as the seed crystal. Instead, in a third preferred embodiment, a (0001) α-type silicon carbide single-crystal layer is formed on the (111) cubic silicon carbide single-crystal layer 15 to serve as the seed crystal before the (0001) α-type silicon carbide single-crystal ingot 19 is formed. Parts, components, elements and the like similar to those in the first and second embodiments are shown with the same reference numerals and detail descriptions thereof will not reiterated.

Figure 13:
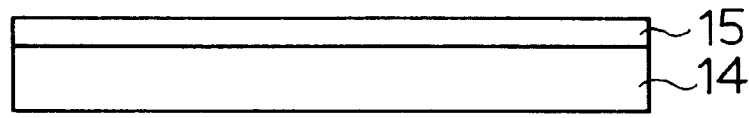
FIGS. 13 to 18 are cross-sectional views for explaining processes of forming a (0001) α-type silicon carbide single-crystal ingot in a third preferred embodiment.
Figure 14:
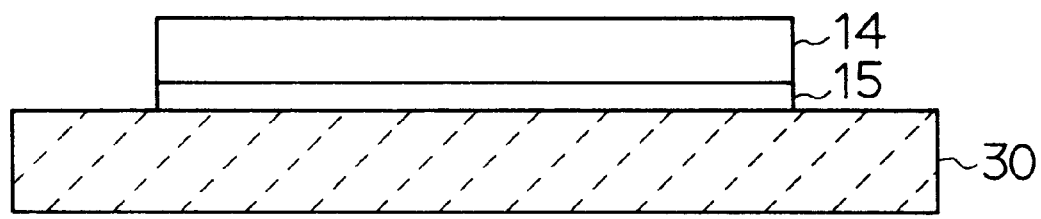
Figure 15:
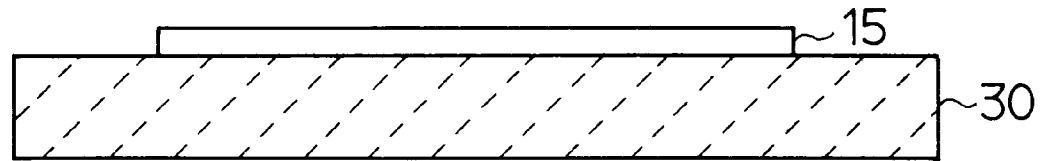
Figure 16:
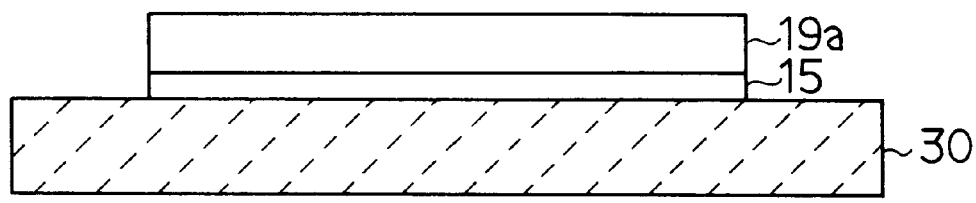
Figure 17:
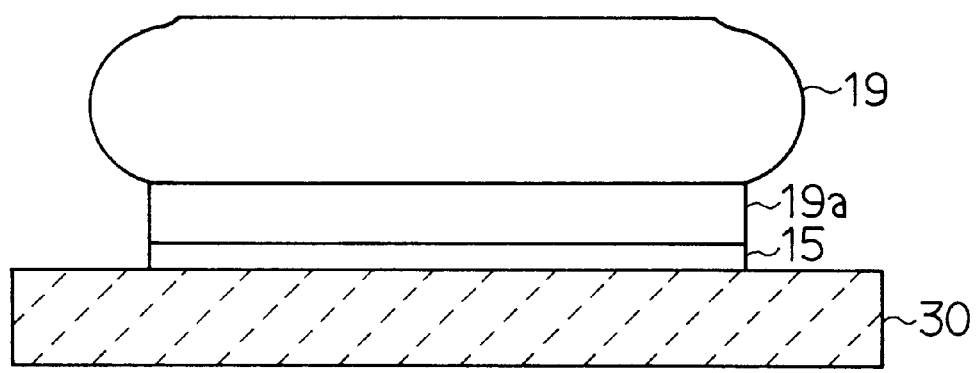

As shown in FIG. 13, the (111) cubic silicon carbide single-crystal layer 15 is epitaxially grown on the silicon wafer 14 by the CVD method as in the first embodiment. As shown in FIG. 14, the surface of the (111) cubic silicon carbide single-crystal layer 15 is joined to a support plate 30. Then, as shown in FIG. 15, the silicon wafer 14 is removed. Further, as shown in FIG. 16, the (0001) α-type silicon carbide single-crystal layer 19a, which is to be the seed crystal, is epitaxially grown on the (111) cubic silicon carbide single-crystal layer 15 by the CVD method. On the (0001) α-type silicon carbide single-crystal layer 19a, as shown in FIG. 17, the (0001) α-type silicon carbide single-crystal ingot 19 is grown by the sublimation-recrystallization method using the crystal growth apparatus 20 shown in FIG. 1.

Figure 19:
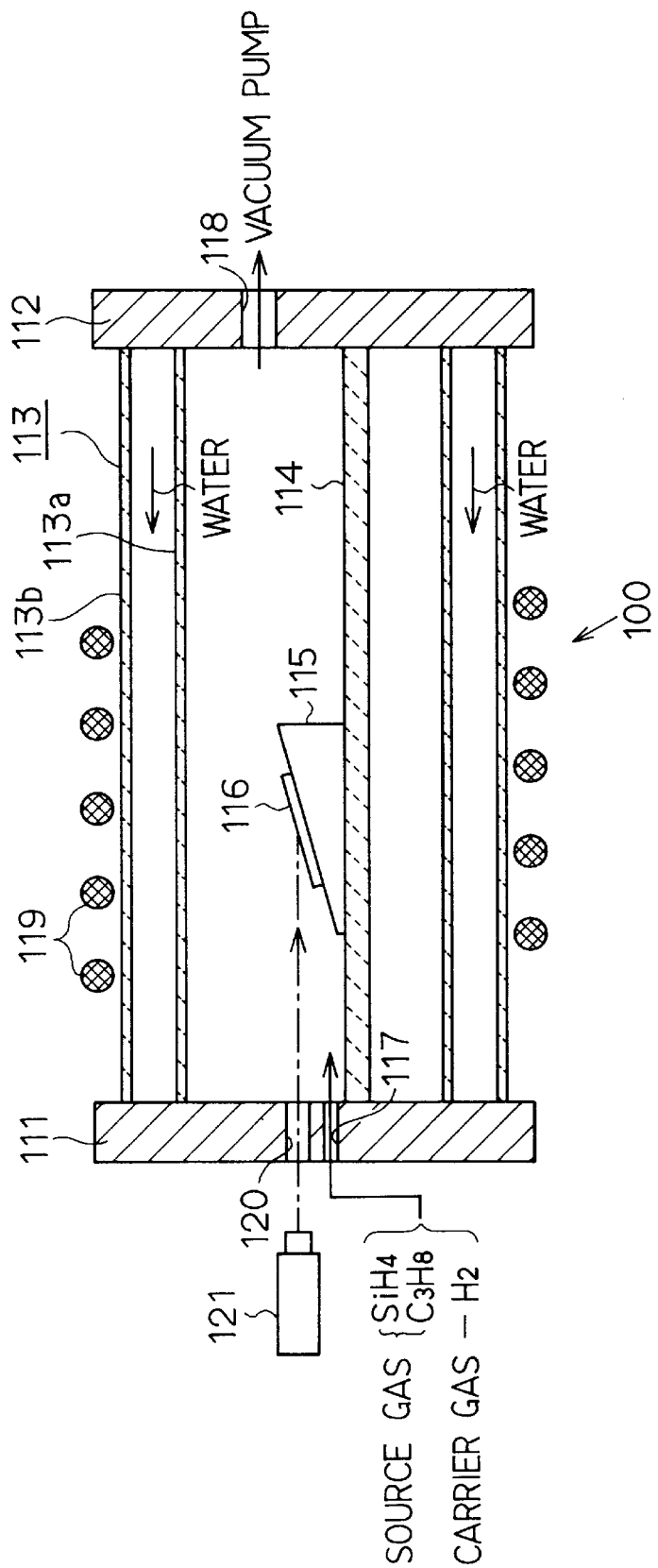
FIG. 19 is a cross-sectional view schematically showing a CVD apparatus used in the third embodiment.

A CVD apparatus 100 used in this embodiment for forming the cubic silicon carbide single-crystal layer 15 and the α-type silicon carbide single-crystal layer 19a is shown in FIG. 19. The CVD apparatus 100 has a double tube 113 composed of an inner tube 113a and an outer tube 113b, which are made of quartz. Both ends of the double tube 113 are sealed with flanges 111 and 112. Further, a quartz plate 114 is disposed within the inner tube 113a, and a support base 115 is disposed on the plate 114. An upper surface of the support base 115 is tapered, and a member 116 on which a layer is to be formed is disposed on the tapered surface. The flange 111 has a gas introduction hole 117 for introducing source gases with a carrier gas into the inner tube 113a, and the flange 112 has a gas discharge hole 118. The inner tube 113a is evacuated through the gas discharge hole 118 of the flange 112 by a vacuum pump.

On an outer surface of the double tube 113, an induction coil 119 is disposed to heat the support base 115 by induction heating upon receiving an electrical power from a high frequency power supply. The member 116 is heated by heat conduction from the support base 115. The flange 111 has a temperature measurement hole 120 and the temperature of the member 116 is measured by a radiation pyrometer 121 using light which is emitted from the member 116 and taken out through the temperature measurement hole 120. In a space between the inner tube 113a and the outer tube 113b, cooling water flows.

Using the thus constructed CVD apparatus 100, the cubic silicon carbide single-crystal layer 15 and the α-type silicon carbide single-crystal layer 19a are respectively formed in the following manner.

First, the silicon wafer 14 is disposed on the support base 115 as the member 116 shown in FIG. 19. Then, the electrical power is supplied to the induction coil 119 from the high frequency power supply to heat the silicon wafer 14 up to 1300° C., while the temperature of the silicon wafer 14 is monitored by the radiation pyrometer 121 through the temperature measurement hole 120. Thereafter, silane ($SiH_4$) and propane ($C_3H_8$) gases, which serve as the source gases, are introduced into the inner tube 113a together with a hydrogen ($H_2$) gas as the carrier gas from the gas introduction hole 117 while the inner tube 113a is evacuated through the gas discharge hole 118 to have a pressure of 10 Torr. Accordingly, the (111) cubic silicon carbide single-crystal layer 15 is grown on the silicon wafer 14 at 1300° C., which is lower than a melting point, i.e., 1400° C., of silicon. The growth temperature of the (111) cubic silicon carbide single-crystal layer 15 can be changed within a range lower than 1400° C.

When forming the (0001) α-type silicon carbide single-crystal layer 19a, the cubic silicon carbide single-crystal layer 15 is joined to the support base 115 and then the silicon wafer 14 is removed. Then, the support base 115 is put in the CVD apparatus 100. In this case, the support base 115 serves as the support plate 30 in FIG. 14. Then, the high frequency power supply supplies the electrical power to the induction coil 119 to heat the cubic silicon carbide single-crystal layer 15 by induction heating. The temperature of the cubic silicon carbide single-crystal layer 15 is increased to be 1500° C., while being monitored by the radiation pyrometer 121 through the temperature measurement hole 120. Then, the source gases of $SiH_4$ and $C_3H_8$ are introduced into the inner tube 113a together with the $H_2$ gas as the carrier gas while the inner tube 113a is evacuated through the gas discharge hole 118 to have a pressure of 10 Torr therein.

In this way, the (0001) α-type silicon carbide single-crystal layer 19a is grown on the (111) cubic silicon carbide single-crystal layer 15 at 1500° C., which is higher than the melting point (1400° C.) of silicon. The preferable growth temperature of the (0001) α-type silicon carbide single-crystal layer 19a is 1500° C. at least, and 2000° C. at most to prevent crystal transition between cubic silicon carbide and α-type silicon carbide. The thus obtained (0001) α-type silicon carbide single-crystal layer 19a has superior crystallinity as compared to that formed by the sublimation-recrystallization method in which crystal defects are liable to be produced. In addition, both of the (111) cubic silicon carbide single-crystal layer 15 and the (0001) α-type silicon carbide single-crystal layer 19a are formed by the CVD method, resulting in low manufacturing cost. A similar method of forming a (0001) α-type silicon carbide single-crystal layer on a (111) cubic silicon carbide single-crystal layer by a two-step CVD method is disclosed in JP-A-61-243000.

When the (0001) α-type silicon carbide single-crystal ingot 19 is formed on the (0001) α-type silicon carbide single-crystal layer 19a by the sublimation-recrystallization method, the α-type silicon carbide single-crystal layer 19a is subject to a high temperature to have a probability that it is sublimated. Therefore, to prevent the sublimation, the preferable thickness of the (0001) α-type silicon carbide single-crystal layer 19a is determined based on the following experiment.

Figure 20:
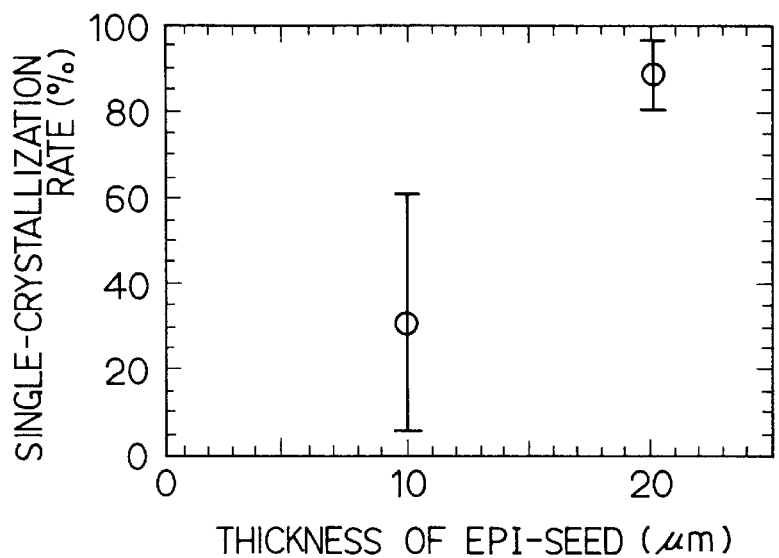
FIG. 20 is a graph showing single-crystallization rates of the (0001) α-type silicon carbide single-crystal ingot relative to a thickness of an epi-seed on which the (0001) α-type silicon carbide single-crystal ingot is formed.

First, two types of α-type silicon carbide single-crystal layers (epi-seeds) were prepared as samples. One type of the epi-seeds had a thickness of 10 μm, and the other type of the epi-seeds had a thickness of 20 μm. Each sample number of the two types of the epi-seeds was 10. Then, α-type silicon carbide single-crystal ingots were respectively grown on the epi-seeds by the sublimation-recrystallization method. FIG. 20 indicates single-crystallization rates of the α-type silicon carbide single-crystal ingots with respect to the thicknesses of the epi-seeds. Each of the single-crystallization rates represents a rate of an area where single-crystal is grown to an entire area of each of the α-type silicon carbide single-crystal ingots.

As shown in FIG. 20, when the thickness of the epi-seeds is 10 μm, the single-crystallization rates are less than 60% and have large variations therein. In this case, it is considered that part of the epi-seeds is sublimated, so that polycrystals grow on the part where the epi-seeds are sublimated and single-crystal grows on the other part. On the other hand, when the thickness of the epi-seeds is 20 μm, the single-crystallization rates exceed 80%, and have small variations therein. In this case, it is considered that the epi-seeds are hardly sublimated when the α-type silicon carbide single-crystal ingots are formed thereon. Based on the results, a preferable thickness of one of the epi-seed, i.e., of the (0001) α-type silicon carbide single-crystal layer 19a is 20 μm or more.

After the (0001) α-type silicon carbide single-crystal layer 19a is formed to have the preferable thickness, as mentioned above, the (0001) α-type silicon carbide single-crystal ingot 19 is formed on the (0001) α-type silicon carbide single-crystal layer 19a using the apparatus 20 shown in FIG. 1. In this embodiment, the crucible lid 4b serves as a base for holding the (0001) α-type silicon carbide single-crystal layer 19a thereon. The crucible lid 4b may be the support plate 30 or be a member other than the support plate 30; however, it is preferable that the crucible lid 4b serves as the support plate 30 as in the first embodiment. This is because employing the crucible lid 4b as the support plate 30 eliminates processes for removing the (0001) α-type silicon carbide single-crystal layer 19a from the support plate 30 and for attaching it to the crucible lid 4b. This also eliminates a possibility of damaging the (0001) α-type silicon carbide single-crystal layer 19a during the handling, because the (0001) α-type silicon carbide single-crystal layer 19a is too thin to be handled. To obtain the same advantageous, the (0001) α-type silicon carbide single-crystal layer 19a may be disposed on the crucible lid 4b through the support plate 30 other than the crucible lid 4b.

In this embodiment, the (0001) α-type silicon carbide single-crystal ingot 19 is epitaxially grown on the (0001) α-type silicon carbide single-crystal layer 19a when the temperature of the silicon carbide source material powder 17 is 2330° C. At that time, the temperature of the (0001) α-type silicon carbide single-crystal layer 19a is 2210° C. that is slightly lower than that of the silicon carbide source material powder 17. This growth uses the (0001) α-type silicon carbide single-crystal layer 19a as the seed crystal, so that it is not accompanied by solid phase transition which causes crystal defects. As a result, the (0001) α-type silicon carbide single-crystal ingot 19 in this embodiment can have a higher crystallinity than that of the first embodiment. The growth temperature of silicon carbide single-crystal should be 2000° C. or more. The preferable temperature of the silicon carbide source material 17 is in a range of 2300° C. to 2350° C., and the preferable temperature of the (0001) α-type silicon carbide single-crystal layer 19a is in a range of 2000° C. to 2300° C.

Figure 18:
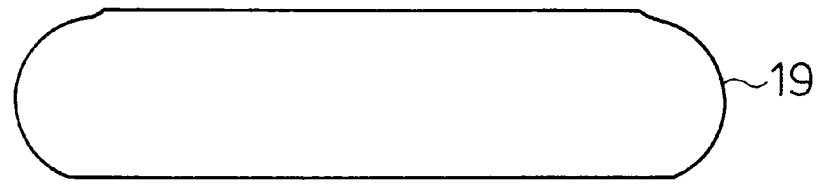

The other features for forming the (0001) α-type silicon carbide single-crystal ingot 19 are substantially the same as those in the first embodiment. The thus obtained (0001) α-type silicon carbide single-crystal ingot 19 was removed from the crucible lid 4b as shown in FIG. 18, and then, was sliced and polished to form a semiconductor substrate. As a result of studying this substrate by X-ray diffraction analysis and Raman spectroscopy, it was confirmed that the crystal structure (polytype structure) of the substrate is 6H-type having a (0001) plane.

In this embodiment, although the (111) cubic silicon carbide single-crystal layer 15 and the (0001) α-type silicon carbide single-crystal layer 19a are formed by the CVD method, those layers may be formed by another method such as a liquid phase epitaxial method, a molecular beam epitaxial method, a vacuum evaporation method, or a sputtering method. It is not always necessary that the (111) cubic silicon carbide single-crystal layer 15 and the (0001) α-type silicon carbide single-crystal layer 19a are formed by the same method.

Fourth Embodiment

Figure 21:
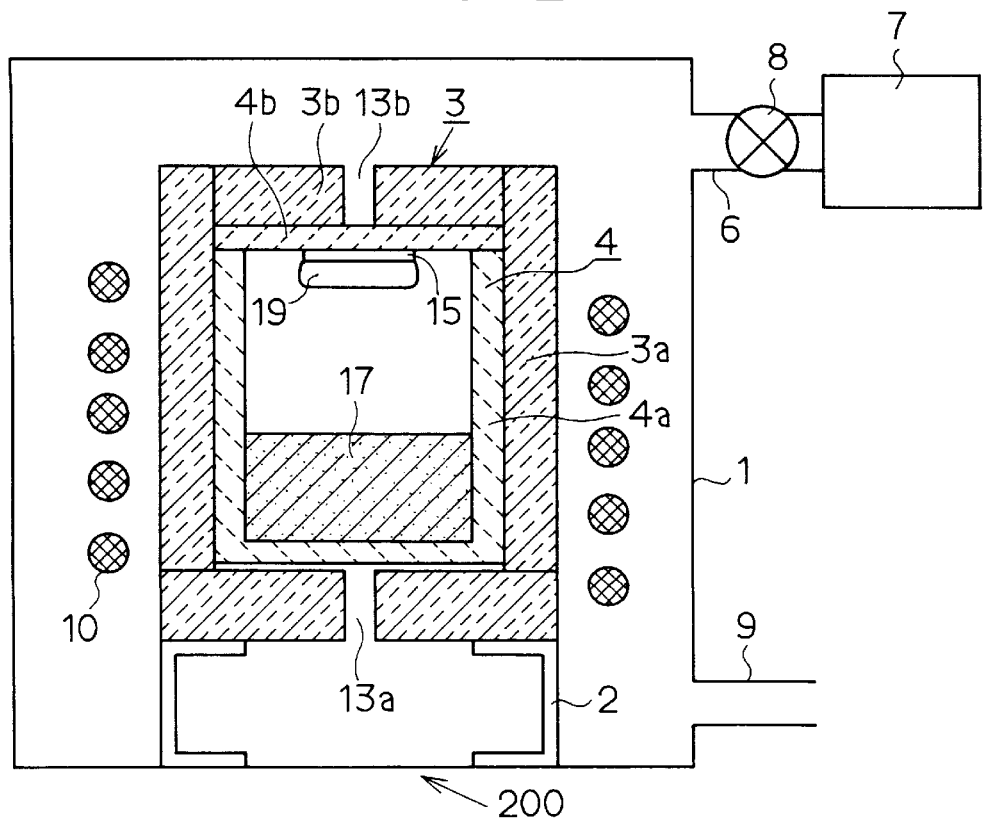
FIG. 21 is a cross-sectional view schematically showing an apparatus used for forming a (0001) α-type silicon carbide single-crystal ingot in a fourth preferred embodiment.

In the first embodiment, the silicon wafer 14 is removed using a solution from the (111) cubic silicon carbide single crystal layer 15 before the silicon carbide single-crystal layer 15 is installed in the growth apparatus 20. Instead, in a fourth preferred embodiment, the (111) silicon carbide single-crystal layer 15 is installed within a growth apparatus together with the silicon wafer 14 and then the silicon wafer 14 is removed from the silicon carbide single-crystal layer 15 within the apparatus. In the fourth embodiment, the growth apparatus 200 shown in FIG. 21 is utilized. Parts, components, elements and the like similar to those in the first embodiment are indicated with the same reference numerals and detail descriptions thereof will not be reiterated.

Figure 22A:
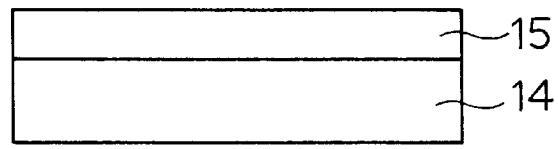
FIGS. 22A to 22E are cross-sectional views for explaining processes for forming the (0001) α-type silicon carbide single-crystal ingot in the fourth embodiment.

Processes for forming the (0001) α-type silicon carbide single-crystal ingot 19 in this embodiment will be explained herebelow with reference to FIGS. 22A to 22E. First, the silicon wafer 14 with a diameter of 4 inches and a thickness in a range of 1 mm to 3 mm is prepared. Then, as shown in FIG. 22A, the (111) cubic silicon carbide single-crystal layer 15 is formed on the silicon wafer 14 by the CVD method as in the first embodiment to have a thickness of 1 μm to 20 μm.

Figure 22B:
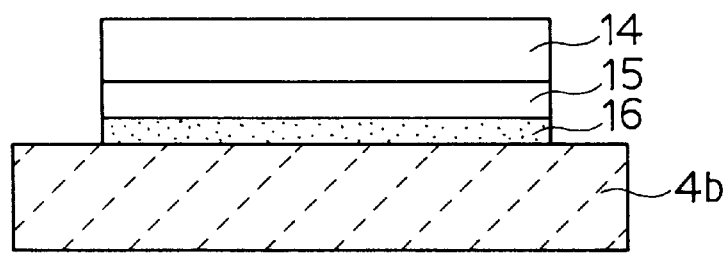
Figure 22C:
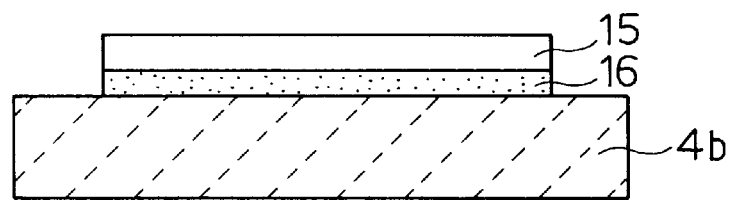

Next, as shown in FIG. 22B, the cubic silicon carbide single-crystal layer 15 is joined to the crucible lid 4b, which is detached from the apparatus 200, together with the silicon wafer 14 through the adhesive 16. In this process, the silicon wafer 14 prevent the cubic silicon carbide single-crystal layer 15 from being deformed and distorted. Therefore, it is not necessary to employ an extra reinforcement member for reinforcing the (111) cubic silicon carbide single-crystal layer 15. If only the cubic silicon carbide single-crystal layer 15 is fixed to the crucible lid 4b after the silicon wafer 14 is removed, the thickness of the silicon carbide single-crystal layer 15 is so thin that it easily meander and is warped to be partially separated from the crucible lid 4b.

Even in the case that the cubic silicon carbide single-crystal layer 15 is attached to the crucible lid 4b together with the silicon wafer 14, there is still a possibility that the cubic silicon carbide single-crystal layer 15 has a warp. This warp occurs when the cubic silicon carbide single-crystal layer 15 is formed on the silicon wafer 14 due to a difference in thermal coefficient between the cubic silicon carbide single-crystal layer 15 and the silicon wafer 14. In such a case, it is necessary that the cubic silicon carbide single-crystal layer 15 is attached to the silicon wafer 14 while restoring the warp. However, restoring the warp accompanies a possibility that the cubic silicon carbide single-crystal layer 15 is damaged.

Figure 23:
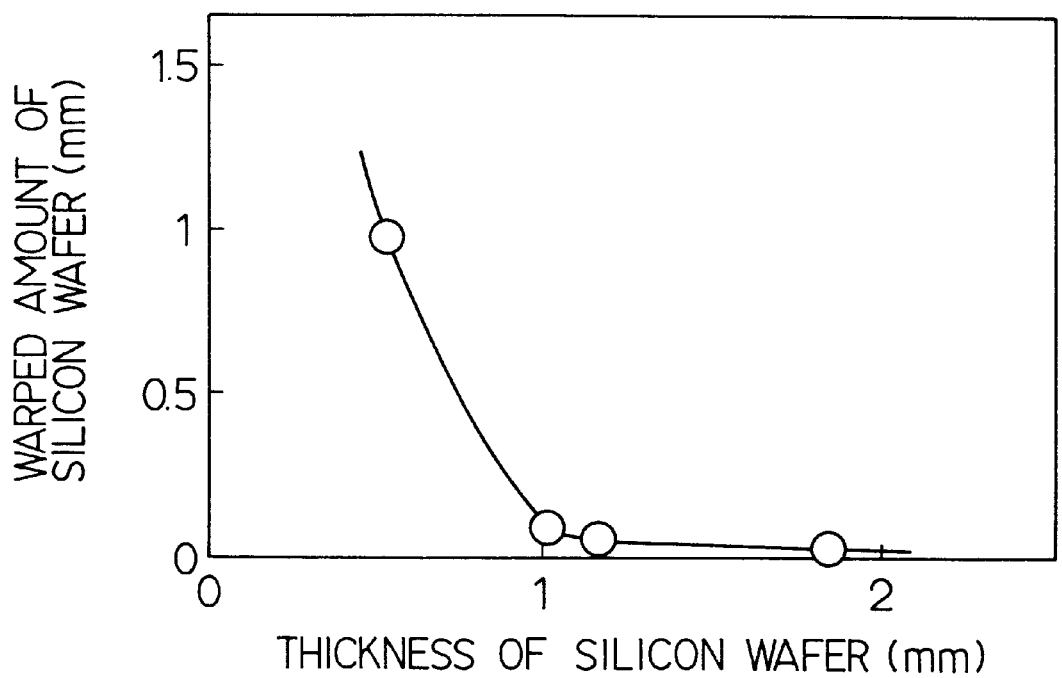
FIG. 23 is a graph showing characteristics of a warped amount of a silicon wafer relative to a thickness thereof in the fourth embodiment.
Figure 24:
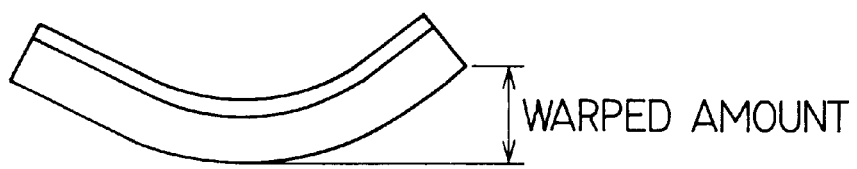
FIG. 24 is a schematic view showing a warped silicon substrate and the warped amount thereof.

To prevent the cubic silicon carbide single-crystal layer 15 from having the warp when it is formed on the silicon wafer 14, it is effective to chose an appropriate thickness of the silicon wafer 14. FIG. 23 shows warped amounts of silicon wafers on which cubic silicon carbide single-crystal layers are formed respectively. In this case, each of the silicon wafers has a diameter of 100 mm, and each of the cubic silicon carbide single-crystal layers has a thickness of 20 μm. When the cubic silicon carbide single-crystal layer is formed on the silicon wafer, both of the cubic silicon carbide single-crystal layer and the silicon wafer are warped due to the difference in thermal coefficient therebetween as shown in FIG. 24. This warped amount (see FIG. 24) is related to the thickness of the silicon wafer. That is, as shown in FIG. 23, as the thickness of the silicon wafer becomes thick, the warped amount of the silicon wafer becomes small. When the thickness of the silicon wafer is 1 mm or more, the warped amount of the silicon wafer is sufficiently small.

Because of this, the silicon wafer 14 used in this embodiment has a thickness of 1 mm or more to thereby prevent the warp of the cubic silicon carbide single-crystal layer 15 formed thereon. More preferably, the thickness of the silicon wafer 14 is 3 mm or less not to expend much time for removing the silicon wafer 14 in the subsequent process.

Next, the crucible lid 4b is installed in the apparatus 200 shown in FIG. 21 so that the cubic silicon carbide single-crystal layer 15 and the silicon wafer 14 are disposed on a lower side of the crucible lid 4b. In this state, the vacuum chamber 1 is evacuated to have a vacuum level in a range of $10^{-3}$ to $10^{-4}$ Torr through the exhaust pipe 6 and the exhaust valve 8. Then, an electrical power is supplied to the induction coil 10 from a high frequency power supply, thereby heating the graphite crucible 4 by induction heating. At that time, the radiation pyrometer measures the temperature of the bottom of the graphite crucible 4 through the temperature measurement hole 13a. After the temperature is raised to 1200° C., argon gas is introduced into the vacuum chamber 1 through the inert gas introducing pipe 9 until the pressure in the vacuum chamber 1 becomes 500 Torr.

Then, the temperature of the graphite crucible 4 is further increased by the induction coil 10 to be higher than the melting point of silicon, so that silicon evaporates from the silicon wafer 14. At that time, the radiation pyrometer measures the temperature of the graphite crucible 4 through the temperature measurement hole 13b. The melting point of silicon is approximately 1400° C. When silicon evaporates, the lower the pressure in the vacuum chamber 1 becomes, the larger the evaporation speed of silicon becomes to decrease time necessary for completely removing the silicon wafer 14. In this embodiment, the pressure in the vacuum chamber 1 is controlled to be 1 Torr. At that time, it is should be noted that the temperature of the graphite crucible 4 is lower than 2000° C. This is because keeping the temperature of the graphite crucible 4 at higher than 2000° C. results in recrystallization, transition of polytype accompanying crystal defects, changes in characteristics of the cubic silicon carbide single-crystal layer 15. By keeping the graphite crucible 4 at a temperature in a range of 1400° C. to 2000° C. for predetermined time, the silicon wafer 14 is completely removed, and only the cubic silicon carbide single-crystal layer 15 is left to serve as the seed crystal.

In this way, in the fourth embodiment, the silicon wafer 14 is removed within the graphite crucible 4. Therefore, the process only for removing the silicon wafer 14 is omitted. That is, it is not necessary to conduct a process for dissolving the silicon wafer 14 by a solution or for removing the silicon wafer 14 by mechanical grinding. The number of processes including handling of the (111) cubic silicon carbide single-crystal layer 15 is reduced, so that the possibility that the cubic silicon carbide single-crystal layer 15 is damaged is reduced. The cubic silicon carbide single-crystal layer 15, which is to be the seed crystal, is not exposed to air after the silicon wafer 14 is removed, preventing contamination of the surface thereof which may cause defects of the (0001) α-type silicon carbide single-crystal ingot 19. The silicon evaporated from the silicon wafer 14 may be discharged from the apparatus 200, or otherwise be left to contribute to form the (0001) α-type silicon carbide single-crystal ingot 19 as a source material.

After the silicon wafer 14 is completely removed, the pressure in the vacuum chamber 1 is returned to 500 Torr, and the temperature of the graphite crucible 4 is increased by the induction coil 10 to be the sublimation temperature of the silicon carbide source material powder 17. The sublimation temperature of the silicon carbide source material powder 17 is 2330° C. At that time, the temperature of the (111) cubic silicon carbide single-crystal layer 15 is lower than that of the silicon carbide source material powder 17 by 50° C. to 350 ° C. due to a relative position thereof between the graphite crucible 4 and the induction coil 10.

Figure 22D:
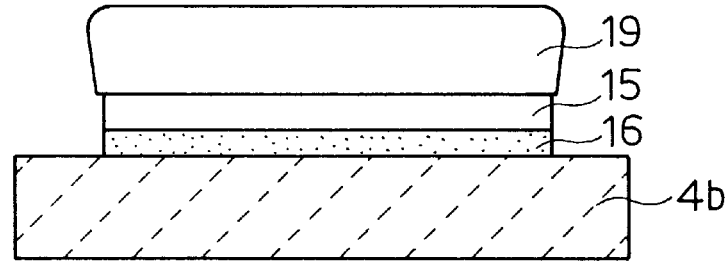
Figure 22E:
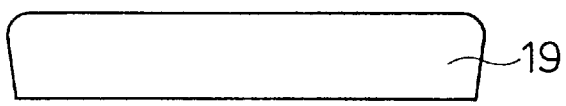

In a state where the temperatures of the silicon carbide source material powder 17 and the (111) cubic silicon carbide single-crystal layer 15 are stable, the (0001) α-type silicon carbide single-crystal ingot 19 is formed by the sublimation-recrystallization method as shown in FIG. 22D. The thus obtained (0001) α-type silicon carbide single-crystal ingot 19 was removed from the crucible lid 4b as shown in FIG. 22E, and then, was sliced and polished to form a semiconductor substrate. As a result of studying this substrate by X-ray diffraction analysis and Raman spectroscopy, it was confirmed that the crystal structure (polytype structure) of the substrate is 6H-type having a (0001) plane. The other features and effects are substantially the same as those in the first embodiment.

Fifth Embodiment

Figure 25A:
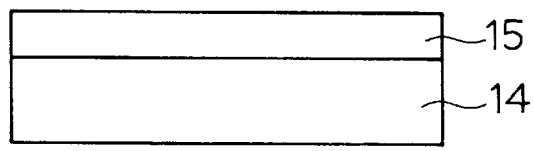
FIGS. 25A to 25F are cross-sectional views for explaining processes of forming a (0001) α-type silicon carbide single-crystal ingot in a fifth preferred embodiment.
Figure 25B:
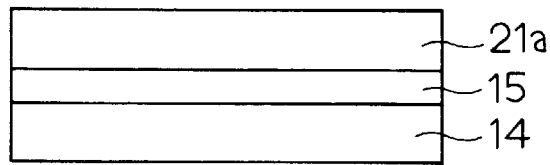

In a fifth preferred embodiment, a reinforcement layer 21a is formed to sandwich the (111) cubic silicon carbide single-crystal layer 15 with the silicon wafer 14. The other features are the same as those in the fourth embodiment. That is, after forming the cubic silicon carbide single-crystal layer 15 on the silicon wafer 14 as shown in FIG. 25A, the reinforcement layer 21a is formed on the cubic silicon carbide single-crystal layer 15 on an opposite side of the silicon wafer 14 as shown in FIG. 25B. The cubic silicon carbide single-crystal layer 15 and the reinforcement layer 21a are successively formed in the same apparatus by the CVD method. The reinforcement layer 21a is made of silicon carbide having crystallinity inferior to that of the cubic silicon carbide single-crystal layer 15. The preferable thickness of the reinforcement layer 21a is in a range of 50 μm to 200 μm.

Figure 25C:
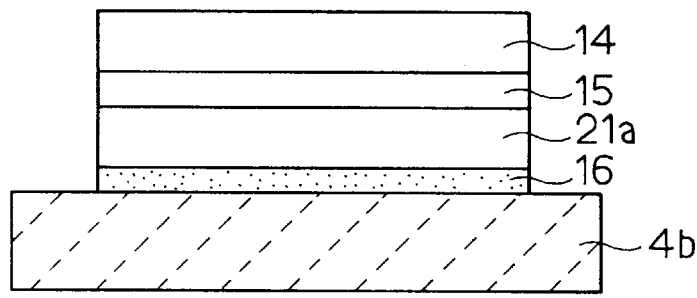
Figure 25D:
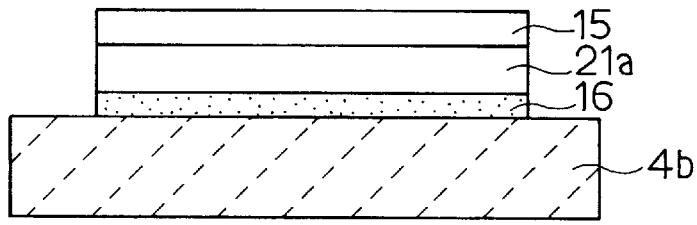
Figure 25E:
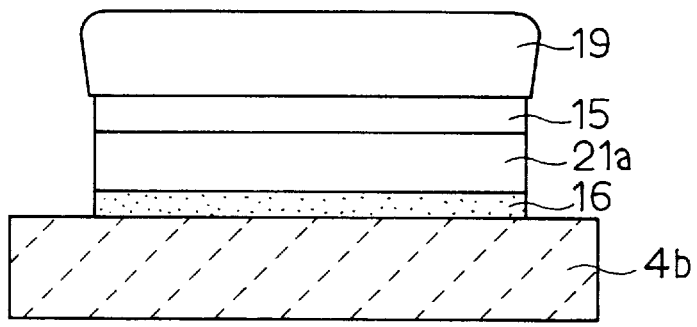
Figure 25F:

Thereafter, as shown in FIG. 25C, the reinforcement layer 21a is directly attached to the crucible lid 4b through the adhesive 16 with the silicon wafer 14 and the cubic silicon carbide single-crystal layer 15. The subsequent processes shown in FIGS. 25D to 25F are substantially the same as those shown in FIGS. 22C to 22E and described in the fourth embodiment. That is, the silicon wafer 14 is removed; the (0001) α-type silicon carbide single-crystal ingot 19 is formed on the (111) cubic silicon carbide single-crystal layer 15; and the (0001) α-type silicon carbide single-crystal ingot 19 is detached from the crucible rid 4b. In the fifth embodiment, because the reinforcement layer 21a reinforces the cubic silicon carbide single-crystal layer 15, the cubic silicon carbide single-crystal layer 15 is further prevented from being damaged.

In the fourth and fifth embodiments, although the silicon wafer 14 is removed in the crystal growth apparatus 200, it may be removed in another apparatus provided that the silicon wafer 14 is removed from the cubic silicon carbide single-crystal layer 15 by a heat treatment. When the silicon wafer 14 is removed by the heat treatment, the number of processes necessitating handling of the silicon carbide single-crystal layer 15 can be decreased as compared to other cases such as that the silicon wafer 14 is removed by a solution and then is washed.

Although the silicon wafer 14 is composed of one wafer, it may be composed of several wafers which are integrally combined to have a preferable thickness. For example, two wafers respectively having a thickness of 0.9 mm may be joined to each other to form the silicon wafer 14. In such a case, even if one of the wafers is broken due to the difference in thermal coefficient between the silicon wafers and the cubic silicon carbide single-crystal layer 15, the cubic silicon carbide single-crystal layer 15 can be prevented from being broken by the other of the wafers. When a desirable thickness of the silicon wafer 14 is nonstandardized, the silicon wafer 14 can be obtained by integrally combining several wafers having thicknesses standardized.

In the fourth and fifth embodiments, the (0001) α-type silicon carbide single-crystal ingot 19 is formed by the sublimation-recrystallization method, it may be formed by other methods such as the CVD method. It is apparent that one of the above-mentioned embodiments can be combined with the other of the above-mentioned embodiments each other. For example, the fourth or fifth embodiment can be combined with the third embodiment.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of producing α-type single-crystal silicon carbide, comprising:
   forming a (111) cubic silicon carbide single-crystal layer, which functions as a seed crystal, on a (111) silicon single-crystal substrate; and
   forming the α-type single-crystal silicon carbide on the (111) cubic silicon carbide single-crystal layer by sublimating a silicon carbide source material,
   wherein a thickness of the (111) silicon single-crystal substrate is larger than approximately 1 mm.

2. A method of producing α-type single-crystal silicon carbide according to claim 1, further comprising a step of removing the (111) silicon single-crystal substrate from the (111) cubic silicon carbide single-crystal layer, before the step of forming the α-type single-crystal silicon carbide on the (111) cubic silicon carbide single-crystal layer.

3. A method of producing α-type single-crystal silicon carbide according to claim 2, wherein;
   the silicon carbide source material and the (111) cubic silicon carbide single-crystal layer are held in a crucible made of graphite.

4. A method of producing α-type single-crystal silicon carbide according to claim 2, wherein;
   the silicon carbide source material is silicon carbide powder.

5. A method of producing α-type single-crystal silicon carbide comprising:
   forming a (111) cubic silicon carbide single-crystal layer, which functions as a seed crystal, on a (111) silicon single-crystal substrate;
   disposing the (111) cubic silicon carbide single-crystal layer in a growth apparatus along with the (111) silicon single-crystal substrate, wherein the silicon single-crystal substrate is removed by melt in the growth apparatus at a temperature higher than a melting point of silicon to expose the (111) cubic silicon carbide single-crystal layer; and
   forming the α-type single-crystal silicon carbide on the (111) cubic silicon carbide single-crystal layer by sublimating a silicon carbide source material in an atmosphere including inert gas, while controlling a temperature of the (111) cubic silicon carbide single-crystal layer to be lower than a temperature of the silicon carbide source material, wherein the α-type single-crystal silicon carbide is formed on the exposed (111) cubic silicon carbide single-crystal layer in the growth apparatus.

6. A method of producing α-type single-crystal silicon carbide according to claim 5, wherein the (111) silicon single-crystal substrate is removed at a temperature lower than 2000° C.

7. A method of producing α-type single-crystal silicon carbide according to claim 5, wherein the α-type single-crystal silicon carbide is formed on the (111) cubic silicon carbide single-crystal layer at a temperature higher than that when the (111) silicon single-crystal substrate is removed.

8. A method of producing α-type single-crystal silicon carbide according to claim 5, wherein a thickness of the (111) silicon single-crystal substrate is in a range of 1 mm to 3 mm.

9. A method of producing α-type single-crystal silicon carbide according to claim 5, wherein the (111) silicon single-crystal substrate is composed of several (111) silicon single-crystal substrates jointed to each other.

10. A method of claim 5, wherein the α-type single-crystal silicon carbide is formed on a growth surface of the (111)

cubic silicon carbide single-crystal layer, which has contacted the (111) silicon single-crystal substrate.

11. A method of claim 10, further comprising attaching the (111) silicon single-crystal substrate to a base member through the (111) silicon carbide single-crystal layer interposed therebetween before the (111) silicon single-crystal substrate is removed, wherein the α-type single-crystal silicon carbide is formed on the growth surface of the (111) silicon carbide single-crystal layer attached to the base member.

12. A method of producing α-type single-crystal silicon carbide according to claim 1, wherein;
   a growth rate of the α-type single-crystal silicon carbide is approximately equal to or lower than 0.2 mm/hr in an initial growth thereof.

13. A method of producing α-type single-crystal silicon carbide according to claim 12, wherein;
   the growth rate of the α-type single-crystal silicon carbide is approximately in a range of 0.2 mm/hr to 2 mm/hr after the initial growth thereof.

14. A method of producing α-type single-crystal silicon carbide according to claim 1, wherein;
   the temperature of the silicon carbide source material is approximately in a range of 2300° C. to 2350° C., and the temperature of the (111) cubic silicon carbide single-crystal layer is lower approximately by 50° C. to 120° C. than the temperature of the silicon carbide source material.

15. A method of producing α-type single-crystal silicon carbide according to claim 1, wherein;
   a pressure of the inert gas is approximately in a range of 0.1 Torr to 100 Torr.

16. A method of producing α-type single-crystal silicon carbide, comprising:
   forming a (111) cubic silicon carbide single-crystal layer, which functions as a seed crystal, on a (111) silicon single-crystal substrate, a silicon member made of silicon being disposed between the (111) silicon carbide single-crystal layer and the silicon carbide source material; and
   forming the α-type single-crystal silicon carbide on the (111) cubic silicon carbide single-crystal layer by sublimating a silicon carbide source material in an atmosphere including inert gas, while controlling a temperature of the (111) cubic silicon carbide single-crystal layer to be lower than a temperature of the silicon carbide source material.

17. A method of producing α-type single-crystal silicon carbide comprising:
   forming a (111) cubic silicon carbide single-crystal layer, which functions as a seed crystal, on a (111) silicon single-crystal substrate;
   forming a reinforcement layer on a top of the (111) cubic silicon carbide single-crystal layer on the opposite side to the (111) silicon single-crystal substrate; and removing the (111) silicon single-crystal substrate from the (111) cubic silicon carbide single-crystal layer and the reinforcement layer; and
   forming the α-type single-crystal silicon carbide on the (111) cubic silicon carbide single-crystal layer by sublimating a silicon carbide source material in an atmosphere including inert gas, while controlling a temperature of the (111) cubic silicon carbide single-crystal layer to be lower than a temperature of the silicon carbide source material.

18. A method of producing α-type single-crystal silicon carbide according to claim 17, wherein;
the reinforcement layer is a silicon carbide poly-crystal layer.

19. A method of producing α-type single-crystal silicon carbide according to claim 17, wherein;
   the (111) cubic silicon carbide single-crystal layer and the silicon carbide source material are disposed in a vessel apart from each other; and
   the (111) cubic silicon carbide single-crystal layer is fixed to an inner surface of the vessel through the reinforcement layer.

20. A method of producing α-type single-crystal silicon carbide, comprising:
   forming a (111) cubic silicon carbide single-crystal layer, which functions as a seed crystal, on a (111) silicon single-crystal substrate; and
   forming the α-type single-crystal silicon carbide on the (111) cubic silicon carbide single-crystal layer by sublimating a silicon carbide source material in an atmosphere including inert gas, while controlling a temperature of the (111) cubic silicon carbide single-crystal layer to be lower than a temperature of the silicon carbide source material, wherein the α-type single-crystal silicon carbide is formed on the (111) cubic silicon carbide single-crystal layer through the α-type silicon carbide single-crystal layer that serves as a seed crystal.

21. A method of producing α-type single-crystal silicon carbide according to claim 20, wherein the α-type silicon carbide single-crystal layer is formed at a temperature lower than that at which cubic silicon carbide is transformed into α-type silicon carbide.

22. A method of producing α-type single-crystal silicon carbide according to claim 20, wherein the α-type silicon carbide single-crystal layer is formed at a temperature lower than 2000° C.

23. A method of producing α-type single-crystal silicon carbide according to claim 20, wherein the α-type silicon carbide single-crystal layer is formed by the same growth method as that for the (111) cubic silicon carbide single-crystal layer.

24. A method of producing α-type single-crystal silicon carbide according to claim 20, wherein the α-type silicon carbide single-crystal layer has a (0001) crystal plane on a surface thereof.

25. A method of producing α-type single-crystal silicon carbide according to claim 20, the α-type silicon carbide single-crystal layer is formed to have a thickness more than 20 μm.

26. A method of producing α-type single-crystal silicon carbide according to claim 20, further comprising a step of removing the (111) silicon single-crystal substrate by melt before the step of forming the α-type silicon carbide single-crystal layer.

27. A method of producing α-type single-crystal silicon carbide according to claim 26, further comprising a step of attaching the (111) cubic silicon carbide single-crystal layer to a lid member of an apparatus for forming the α-type single-crystal silicon carbide by a sublimation method, before the step of removing the (111) silicon single-crystal substrate.

28. A method of producing α-type single-crystal silicon carbide, comprising:
   forming a (111) cubic silicon carbide single-crystal layer, which functions as a seed crystal, on a (111) silicon single-crystal substrate;
   attaching the (111) cubic silicon carbide single-crystal layer to a lid member of an apparatus for forming the α-type single-crystal silicon carbide by sublimation method, wherein said sublimation method is in an atmosphere including inert gas, while controlling a temperature of the (111) cubic silicon carbide single-crystal layer to be lower than a temperature of the silicon carbide source material; and removing the (111) silicon single-crystal substrate from the (111) cubic silicon carbide single-crystal layer by melt.

29. A method of claim 1, wherein the α-type single-crystal silicon carbide is formed in an atmosphere including inert gas, while controlling a temperature of the (111) cubic silicon carbide single-crystal layer to be lower than a temperature of the silicon carbide source material.

30. A method of claim 1, wherein the thickness of the (111) silicon single-crystal substrate is smaller than approximately 3 mm.

31. A method of claim 30, further comprising:

attaching the (111) cubic silicon carbide single-crystal layer disposed on the (111) silicon single-crystal substrate to a base member, at a side opposite to the (111) silicon single-crystal substrate; and removing the (111) silicon single-crystal substrate from the (111) cubic silicon carbide single-crystal layer attached to the base member to thereby expose a growth surface of the (111) cubic silicon carbide single-crystal layer, wherein the retype single-crystal silicon carbide is formed on the growth surface of the (111) cubic silicon carbide single-crystal layer.

32. A method of producing α-type single-crystal silicon carbide comprising steps of:

forming a (111) cubic silicon carbide single-crystal layer, which functions as a seed crystal, on a (111) silicon single-crystal substrate;

removing the (111) silicon single-crystal substrate from the (111) cubic silicon carbide single-crystal layer;

disposing silicon carbide source material powder and the (111) cubic silicon carbide single-crystal layer apart from the silicon carbide source material powder in a growth apparatus;

forming a (0001) α-type silicon carbide single-crystal layer on the (111) cubic silicon carbide single-crystal layer by sublimating the silicon carbide source material powder at a first growth rate equal to or lower than 0.2 mm/hr; and forming the (0001) α-type silicon carbide single-crystal layer successively at a second growth rate more than 0.2 mm/hr.

33. A method of producing α-type single-crystal silicon carbide according to claim 32, wherein;

in the steps of forming the (0001) α-type single-crystal silicon carbide on the (111) cubic silicon carbide single-crystal layer, the first and the second growth rates are changed in response to a temperature difference between the (111) cubic silicon carbide single-crystal layer and the silicon carbide source material powder.

34. A method of producing α-type single-crystal silicon carbide according to claim 33, wherein;

the temperature of the (111) cubic silicon carbide single-crystal layer is lower approximately by 50° C. to 120° C. than a temperature of the silicon carbide source material powder.

35. A method of producing α-type single-crystal silicon carbide according to claim 32, wherein;

a silicon member made of silicon is disposed between the (111) cubic silicon carbide single-crystal layer and the silicon carbide source material powder.

36. A method of producing α-type single-crystal silicon carbide, comprising steps of:

forming a (111) cubic silicon carbide single-crystal layer on a (111) silicon single-crystal substrate;

disposing the (111) cubic silicon carbide single-crystal layer together with the (111) silicon single-crystal substrate in a growth apparatus;

melting the (111) silicon single-crystal substrate in the growth apparatus to expose the (111) cubic silicon carbide single-crystal layer, at a temperature higher than a melting point of silicon; and forming the α-type single-crystal silicon carbide on the exposed (111) cubic silicon carbide single-crystal layer by sublimating a silicon carbide source material in the growth apparatus.

37. A method of claim 36, wherein the (111) silicon single-crystal substrate is removed from the (111) cubic silicon carbide single-crystal layer at a first temperature, and wherein the α-type single-crystal silicon carbide is formed on the (111) cubic silicon carbide single-crystal layer at a second temperature higher than the first temperature.

38. A method of claim 36, wherein the (111) cubic silicon carbide single-crystal layer is attached to a base in the growth apparatus such that the (111) silicon single-crystal substrate faces the silicon carbide source material, and wherein a surface of the (111) silicon carbide single-crystal layer is exposed to face the silicon carbide source material by removing the (111) silicon single-crystal substrate.

39. A method of claim 38, wherein the base is a lid of a crucible, and the silicon carbide source material is held in the crucible.

40. A method of claim 38, further comprising a step of forming a reinforcement layer on the (111) cubic silicon carbide single-crystal layer to sandwich the (111) cubic silicon carbide single-crystal layer with the (111) silicon single-crystal substrate, before disposing the (111) cubic silicon carbide single-crystal layer in the growth apparatus, wherein the reinforcement layer is attached to the base in the growth apparatus so that the (111) silicon single-crystal substrate faces the silicon carbide source material.

41. A method of producing α-type single-crystal silicon carbide, comprising of:

forming a (111) cubic silicon carbide single-crystal layer, which functions as a seed crystal, on a (111) silicon single-crystal substrate;

removing the (111) silicon single-crystal substrate from the (111) cubic silicon carbide single-crystal layer by melt within a growth apparatus to expose a growth surface of the (111) cubic silicon carbide single-crystal layer, which has contacted the (111) silicon single-crystal substrate; and forming the α-type single-crystal silicon carbide on the growth surface of the (111) cubic silicon carbide single-crystal layer while keeping a state of the (111) cubic silicon carbide single-crystal layer when the (111) silicon single-crystal substrate is removed within the growth apparatus.

42. A method of claim 41, further comprising attaching the (111) silicon single-crystal substrate to a base member through the (111) cubic silicon carbide single-crystal layer interposed therebetween within the growth apparatus before removing the (111) silicon single-crystal substrata.

43. A method of claim 41, wherein the (111) cubic silicon carbide single-crystal layer is formed only on a main surface of the (111) silicon single-crystal substrate so that the growth surface of the (111) cubic silicon carbide single-crystal layer is flat after the (111) silicon single-crystal substrate is removed.

44. A method of claim 41, wherein silicon produced by melting the (111) silicon single-crystal substrate is used to form the α-type single-crystal silicon carbide.

45. A method of producing α-type single-crystal silicon carbide, comprising steps of:

forming a (111) cubic silicon carbide single-crystal layer, which functions as a seed crystal, on a (111) silicon single-crystal substrate;

forming a first part of the retype single-crystal silicon carbide on the (111) cubic silicon carbide single-crystal layer by sublimating a silicon carbide source material at a first growth rate equal to or less than 0.2 mm/hr; and forming a second part of the α-type single-crystal silicon carbide on the first part of the α-type single-crystal by sublimating the silicon carbide source material at a second growth rate higher than 0.2 mm/hr.

46. A method of claim 45, wherein the second growth rate is in a range of 0.2 mm/hr to 2 mm/hr.

47. A method of claim 45, wherein the first growth rate and the second growth rate are controlled by a temperature of the (111) cubic silicon carbide single-crystal layer.

48. A method of claim 45, wherein forming the first part of the α-type single-crystal silicon carbide and forming the second part of the α-type single-crystal silicon carbide are continuously performed within a growth apparatus.

* * * * *